US005530814A

United States Patent [19]
Wong et al.

[11] Patent Number: 5,530,814
[45] Date of Patent: Jun. 25, 1996

[54] BI-DIRECTIONAL CROSSBAR SWITCH WITH CONTROL MEMORY FOR SELECTIVELY ROUTING SIGNALS BETWEEN PAIRS OF SIGNAL PORTS

[75] Inventors: Chun C. D. Wong; Wen-Jai Hsieh; Chi-Song Horng, all of Palo Alto, Calif.

[73] Assignee: I-Cube, Inc., Santa Clara, Calif.

[21] Appl. No.: 333,290

[22] Filed: Nov. 2, 1994

Related U.S. Application Data

[63] Continuation-in-part of Ser. No. 171,752, Dec. 21, 1993, Pat. No. 5,426,738, which is a continuation of Ser. No. 785,082, Oct. 30, 1991, abandoned.

[51] Int. Cl.$^6$ .................................................. G06F 13/00
[52] U.S. Cl. ........................ 395/312; 395/311; 326/41; 326/82; 364/DIG. 2; 364/239; 364/926.1; 364/926.2
[58] Field of Search .............................. 395/312, 317; 326/41, 39, 82

[56] References Cited

U.S. PATENT DOCUMENTS

| | | | |
|---|---|---|---|
| 4,739,250 | 4/1988 | Tanizawa | 324/73 |
| 5,038,192 | 8/1991 | Bonneau et al. | 357/45 |
| 5,282,271 | 6/1994 | Hsieh et al. | 395/275 |
| 5,426,738 | 6/1995 | Hsieh et al. | 395/275 |
| 5,428,750 | 6/1995 | Hsieh et al. | 395/275 |
| 5,428,800 | 6/1995 | Hsieh et al. | 395/775 |
| 5,452,231 | 9/1995 | Butts et al. | 364/486 |
| 5,457,409 | 10/1995 | Agrawal et al. | 326/39 |
| 5,465,056 | 11/1995 | Hsieh et al. | 326/41 |

*Primary Examiner*—Christopher B. Shin
*Attorney, Agent, or Firm*—Smith-Hill and Bedell

[57] ABSTRACT

A hierarchical crossbar switch includes several switch arrays, each switch array including several switch cells. Each switch cell interconnects a unique pair of signal ports and provides a bi-directional signal path between the signal ports it interconnects when switched on by an enabling signal. A first memory array stores input data indicating particular switch cells to be switched on. A second memory array stores input data indicating particular ones of the switch arrays to be enabled. The crossbar switch also includes a logic cell array that reads the data stored in the first and second memories and sends separate control signals to each switch cell. Each control signal switches on the switch cell to which it is sent when data in the first and second memory arrays indicate both that the switch cell is to be switched on and that the switch cell array including the switch cell is to be enabled.

9 Claims, 8 Drawing Sheets

30

BI-DIRECTIONAL CROSSBAR SWITCH WITH CONTROL MEMORY FOR SELECTIVELY ROUTING SIGNALS BETWEEN PAIRS OF SIGNAL PORTS

CROSS-REFERENCE TO RELATED APPLICATIONS

The present application is a continuation-in-part of application Ser. No. 08/171,752, filed Dec. 21, 1993, patented U.S. Pat. No. 5,426,738, which is in turn a continuation of application Ser. No. 07/785,082, filed Oct. 30, 1991, now abandoned.

BACKGROUND OF THE INVENTION

1. Field of the Invention

The present invention relates in general to crossbar switches and in particular to a crossbar switch that provides rapid switching of buses.

2. Description of Related Art

Some crossbar switches use multiplexers to selectively route signals between input and output ports. Multiplexer type crossbar switches are often used to quickly change routing of signals between buses. Normally a bus switching crossbar switch can selectively connect any one of its input ports to any one of only a limited number of its output ports. For example a crossbar switch designed for connecting any of four 8-bit buses to any one of four 8-bit output buses may consist of 32 multiplexers each selectively connecting one input port to any one of four of the 32 output ports. In a multiplexer based crossbar switch signal routing can be changed quickly by changing the control data supplied to the multiplexers. However a multiplexer-based crossbar switch may have limited flexibility in interconnecting switch ports. Also in such a multiplexer-based crossbar switch, signals may flow in only one direction between ports. Therefore such crossbar switches are not capable of handling bi-directional signals—signals that can flow in either direction between two ports.

Another type of crossbar switch is described in U.S. Pat. No. 5,282,274 entitled "I/O Buffering System to a Programmable Switching Apparatus", issued Jan. 25, 1994 to Hsieh et al. This crossbar switch selectively interconnects each pair of a set of N switch ports using switching transistors. When a switching transistor is turned on, it provides a bi-directional signal path between the two ports it interconnects. The switch transistors are arrayed on an integrated circuit and each switch transistor is turned on or off by a bit stored in a nearby memory cell. The routing pattern of signals through the crossbar switch is controlled by writing a data bit into each of the memory cells of the array. This switch array type of crossbar switch is typically more compact and flexible than a multiplexer type switch and can route bi-directional signals.

One disadvantage of the matrix type array is the speed with which it can change signal routing. Data is written to one row of memory cells at a time and it requires many clock cycles to reconfigure matrix array switching patterns.

What is needed is a bi-directional crossbar switch having the flexibility of a matrix array type switch and the switching speed of a multiplexer type switch.

SUMMARY OF THE INVENTION

In accordance with the present invention, a hierarchical crossbar switch includes many input/ouput signal ports, several switch arrays, each switch array including several switch cells. Each switch cell interconnects a unique pair of signal ports and provides a bi-directional signal path between the signal ports it interconnects when switched on by an enabling signal. A first memory array stores input data indicating particular switch cells to be switched on. A second memory array stores input data indicating particular ones of the switch arrays to be enabled. The crossbar switch also includes logic that reads the data stored in the first and second memories and sends separate enabling signals to each switch cell. Each enabling signal switches on the switch cell to which it is sent when data in the first and second memory arrays indicate both that the switch cell is to be switched on and that the switch cell array including the switch cell is to be enabled.

By writing data into the second memory array enabling all of the switch arrays, the crossbar switch may be used in a manner similar to a conventional crossbar switch. In this mode of operation, signals routing between selected ports is controlled by appropriately writing data into the first memory array.

On the other hand, when several buses are connected to the crossbar switch signal ports, input data written into the first memory array indicates how each switch array is to interconnect a separate pair of the buses when the switch array is enabled. Data written into the second memory array indicates which switch arrays are to be enabled and therefore indicates which pairs of buses are currently interconnected. By changing only a relatively small amount of data stored in the second memory array, the bus interconnections can be quickly changed.

It is accordingly an object of the invention to provide a bi-directional crossbar switch that can selectively route signals between pairs of input ports.

It is another object of the invention to provide a bi-directional crossbar switch that can quickly change connections between a set of buses.

The concluding portion of this specification particularly points out and distinctly claims the subject matter of the present invention. However those skilled in the art will best understand both the organization and method of operation of the invention, together with further advantages and objects thereof, by reading the following description in view of the accompanying drawings wherein like reference characters refer to like elements.

BRIEF DESCRIPTION OF THE DRAWING(S)

DESCRIPTION OF THE PREFERRED EMBODIMENT(S)

Figure 1:
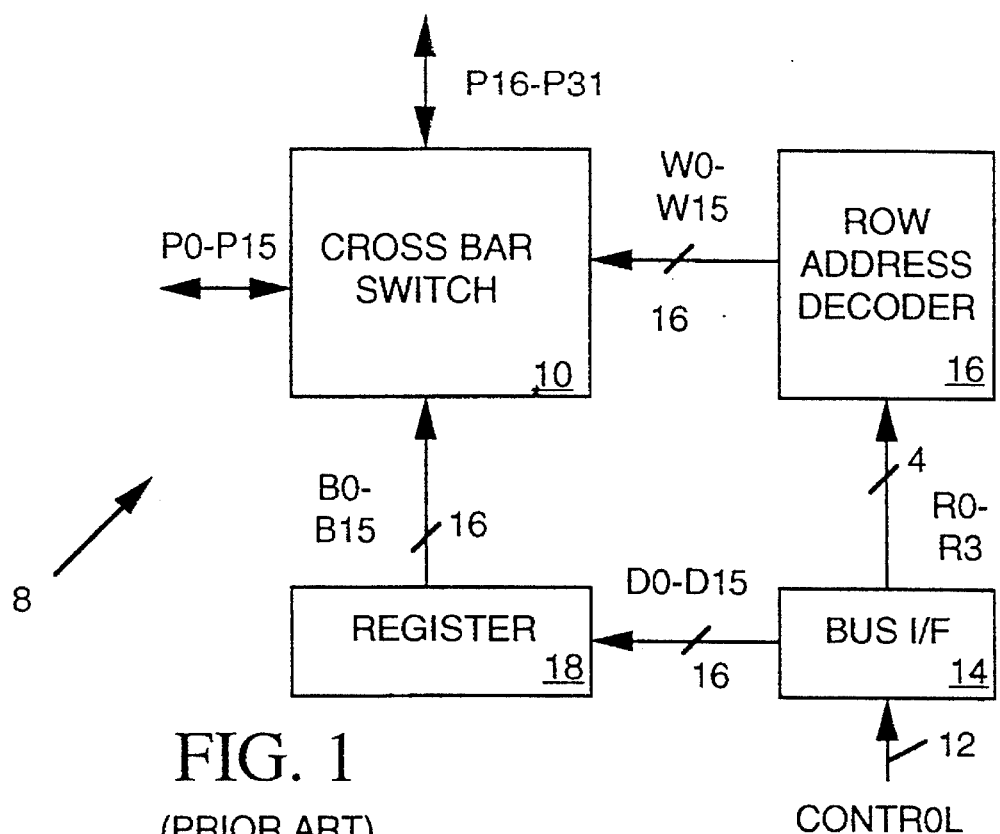
FIG. 1 is a block diagram illustrating a prior art crossbar switch and associated control blocks.

FIG. 1 shows a switching system 8 utilizing a prior art crossbar switch 10 having thirty-two bi-directional ports P0–P31. Crossbar switch 10, programmed by data conveyed over a serial control bus 12, can connect any port P0–P15 to any other port P16–P31 so that signals may pass bi-directionally there between. The control bus 12 delivers programming data including four-bit row address and sixteen-bit switch control data D0–D15 to a bus interface (I/F) circuit 14. Interface circuit 14 passes the row addresses R0–R3 to a row address decoder 16 and passes the switch control data to a register 18. Decoder 16 decodes the row address and asserts a selected one of 16 word lines W0–W15, thereby causing the crossbar switch 10 to acquire and store the switch control data from register 18 via bit lines B0–B15.

Figure 2:
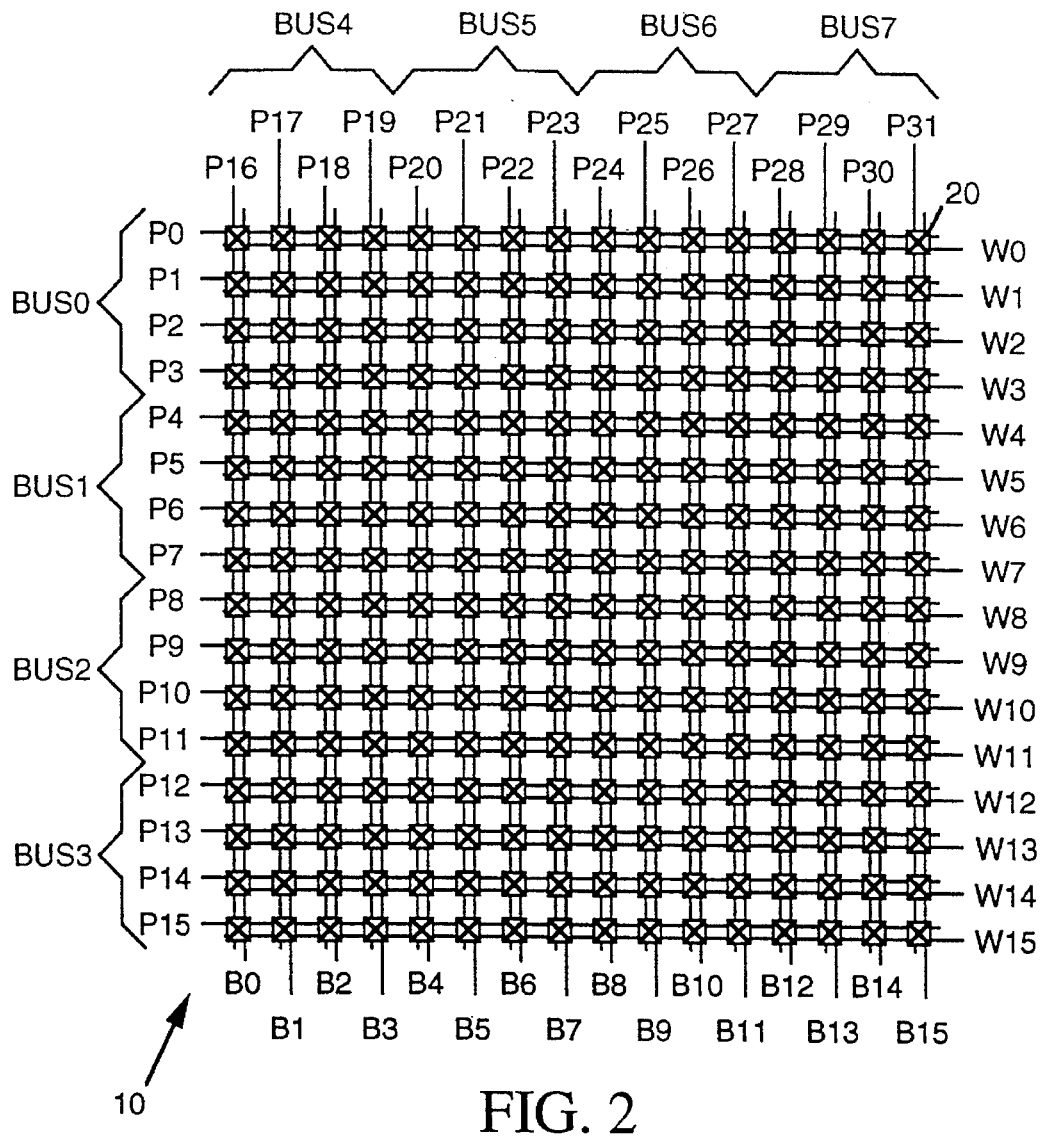
FIG. 2 is a block diagram illustrating the prior art crossbar switch of FIG. 1 in greater detail.

FIG. 2 illustrates the prior art crossbar switch 10 of FIG. 1 in greater detail. Switch 10 is formed by a 16×16 array of switch cells 20. Each switch cell 20 selectively provide a bi-directional signal path between one of ports P0–P15 and one of ports P16–P31. Each horizontal row of switch cells 20 is also connected to a separate word line W0–W15 and each vertical column of switch cells is connected to a separate bit line B1–B15. When, for example, a signal on word line W6 is asserted, each of the 16 switch cells 20 connected to word line W6 stores a data bit appearing on the particular bit line B0–B15 to which it is connected. The state of the stored bit indicates to each switch cell 20 whether it is to provide a bi-directional signal path between the two ports to which it is connected.

Figure 3:
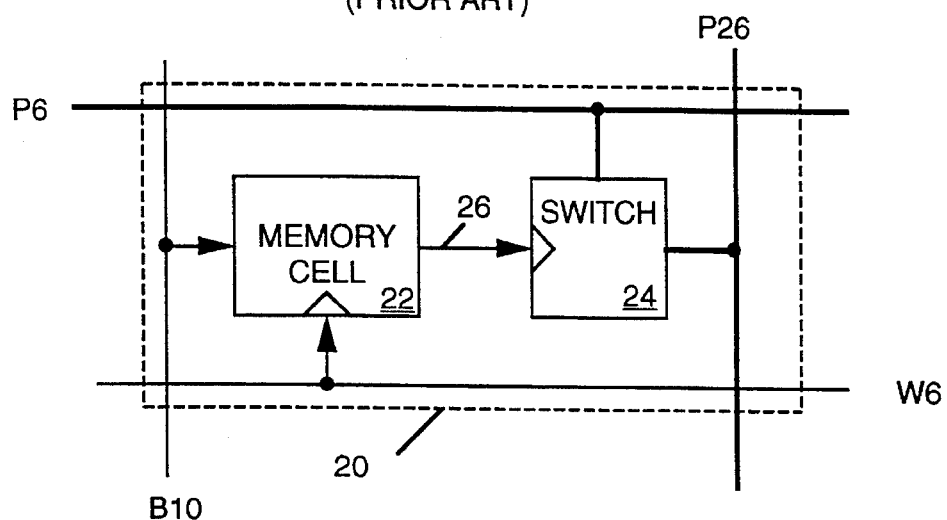
FIG. 3 is a block diagram illustrating a switch cell of the crossbar switch of FIG. 2.

FIG. 3 illustrates a typical prior art switch cell 20. In this example, the switch cell 20 is connected to word line W6, bit line B10 and ports P6 and P26. Switch cell 20 includes a memory cell 22 and a transistor switch 24. Bit line B10 controls a data input of memory cell 22 while word line W6 controls a write control input of memory cell 22. When word line W6 is asserted, memory cell 22 stores the data bit currently appearing on bit line B10. Memory cell 22 asserts or deasserts an output control signal 26 in accordance with the state of its stored bit. Control signal 26 is applied to a control input of transistor switch 24. Switch 24 is connected between ports P6 and P26. Switch 24 provides a bi-directional signal path between ports P6 and P26 when control signal 26 is asserted.

Referring again to FIGS. 1 and 2, we see that to fully program crossbar switch 10, control bus 12 must send sixteen control data bits B0–B15 and four row address bits R0–R3 for each of the sixteen rows of switch cells 20, a total of 320 bits. Since it is a serial bus, control bus 12 requires 320 bus cycles to convey the necessary programming data.

Crossbar switch 10 of FIG. 1 can selectively interconnect a set of parallel buses. For example as shown in FIG. 2, a set of four bit wide parallel bus BUS0–BUS3 may be tied to P0–P16 while a second set of four-bit wide parallel buses BUS4–BUS7 are tied to P16–P31. Crossbar switch 10 can selectively connect any bus BUS0–BUS3 to any other bus BUS4–BUS7. However, since crossbar switch 10 requires up to 320 data cycles on control bus 12 to change the manner in which the buses are interconnected, switching between the buses is slow.

Figure 4:
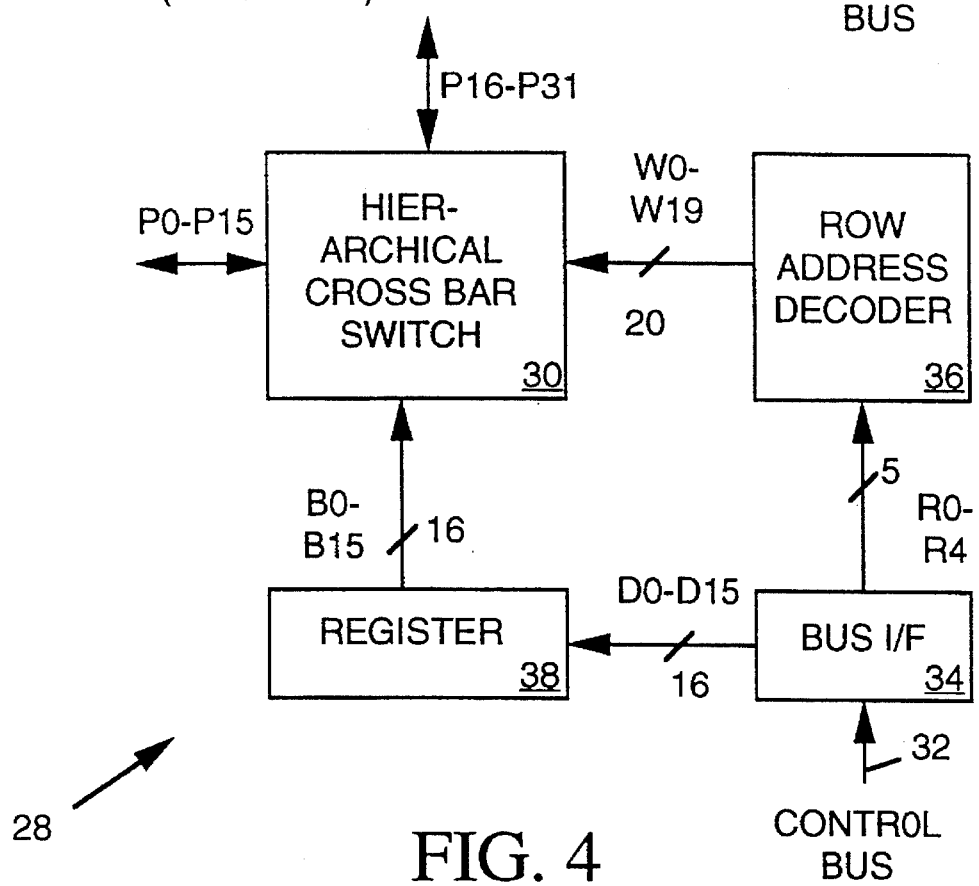
FIG. 4 is a block diagram illustrating a hierarchical crossbar switch and associated control devices in accordance with the present invention.

FIG. 4 illustrates a switching system 28 utilizing a hierarchical crossbar switch 30 in accordance with the present invention. Like the prior art switching system of FIG. 1, switching system 28 also has 32 bi-directional ports P0–P31 and may be programmed by data conveyed over a serial control bus 32 to connect any port P0–P15 to any other port P16–P31 so that signals may pass bi-directionally there between. Also like the prior art switching system of FIG. 1, control bus 32 delivers a 16 bit data word D0–D15 to a register 38 for subsequent writing into memory cells within crossbar switch 30 via bit lines B0–B15. However in switching system 28, control bus 32 delivers a five-bit row address R0–R4 (rather than a four-bit row address) to interface circuit 34. Interface circuit 34 passes the 5-bit row address to a row address decoder 36. Decoder 36 decodes the 5-bit row address R0–R4 to assert one of 20 word lines W0–W19, thereby causing the crossbar switch 30 to acquire the switch control data from register 38 via bit lines B0–B15.

Figure 5A:
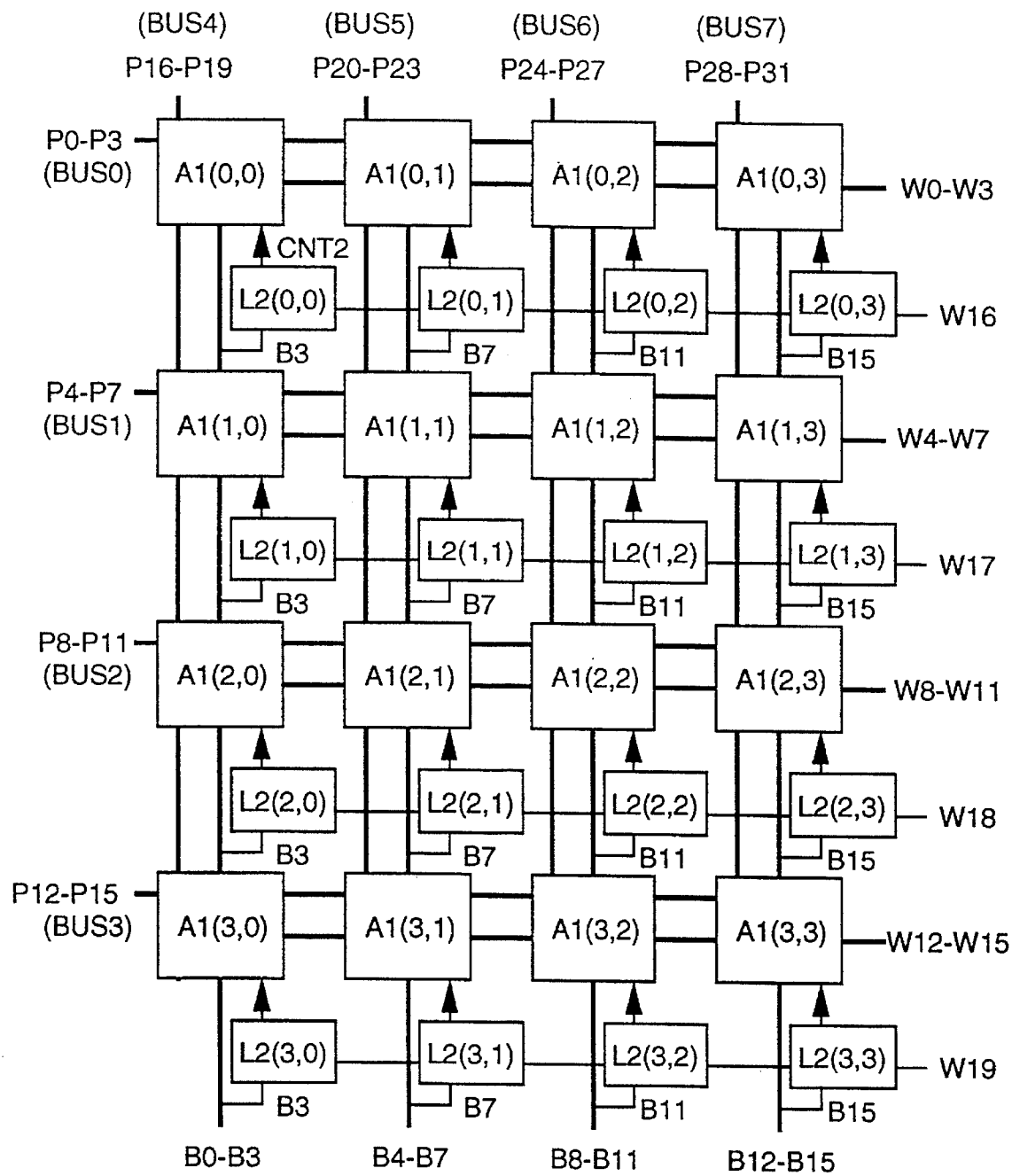
FIG. 5A is a block diagram illustrating the hierarchical crossbar switch of FIG. 4 in greater detail.

FIG. 5A illustrates the hierarchical crossbar switch 30 of FIG. 4 in greater detail. Switch 30 includes sixteen "first level" arrays A1(i,j) where i and j are members of the set {0, 1, 2, 3}. Arrays A1(0,j), A1(1,j), A1(2,j) and A1(3,j) are connected to ports P0–P3, P4–P7, P8–P11 and P12–P15, respectively, and to word lines W0–W3, W4–W7, W8–W11 and W12–W15, respectively. Arrays A1(i,0), A1(i,1), A1(i,2) and A1(i,3) are also connected to ports P16–P19, P20–P23, P24–P27 and P28–P31, respectively, and to bit lines B0–B3, B4–B7, B8–B11 and B12–B15, respectively. Each array A1(i,j) can selectively interconnect the ports to which it is connected in accordance with data bits and control bits carried on the bit and word lines it is connected.

Switch 30 also includes an array of sixteen second level control cells L2(i,j), each supplying a separate control signal CNT2 to a corresponding one of first level arrays A1(i,j). When asserted, the control signal CNT2 enables the interconnect operation of the first level array A1(i,j). When not asserted, control signal CNT2 inhibits the interconnect operation of the first level array A1(i,j).

Figure 5B:
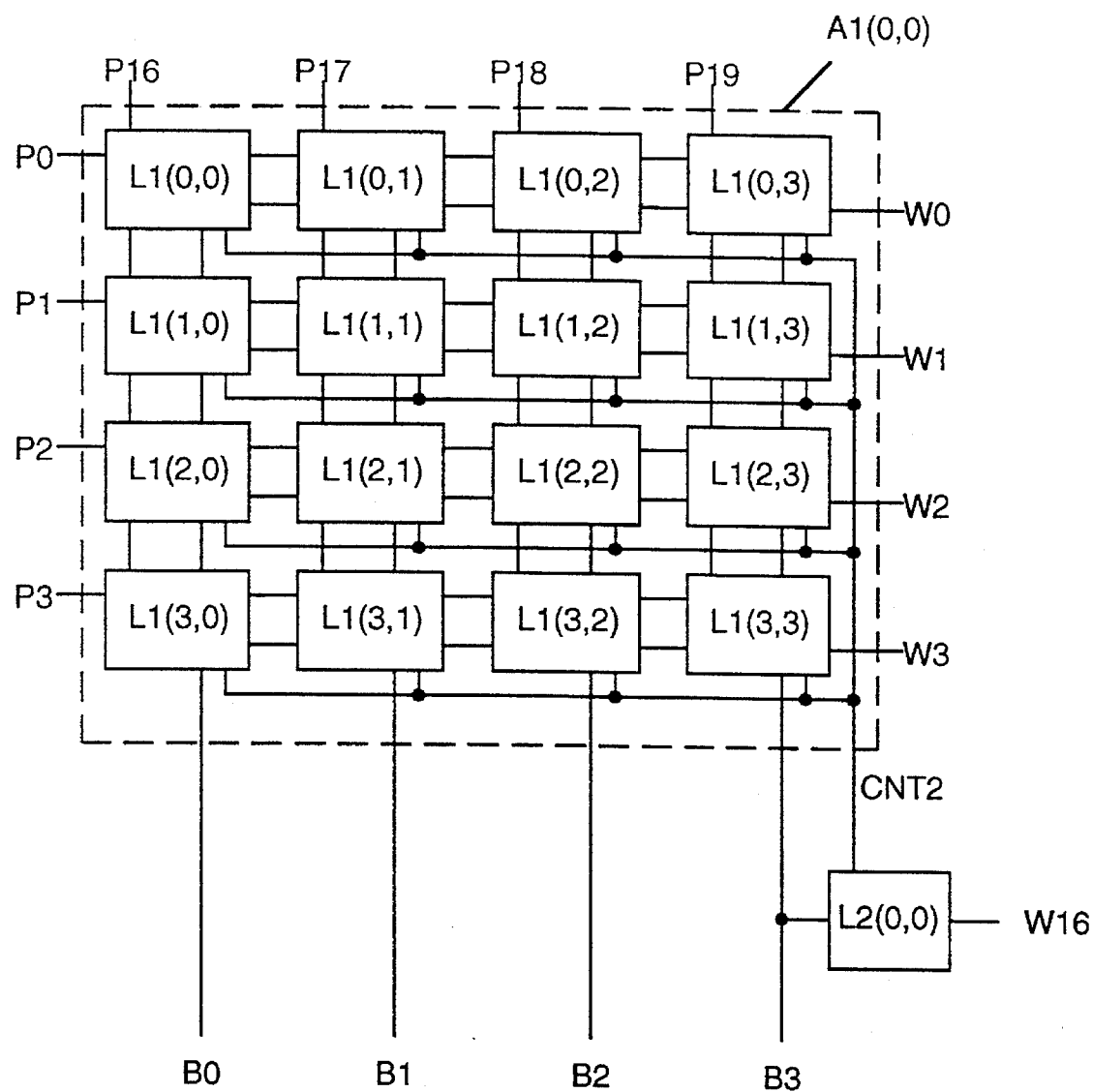
FIG. 5B is a block diagram illustrating a portion of the crossbar switch of FIG. 4 in greater detail.

FIG. 5B illustrates details of first level array A1(0,0) and shows second level control cell L2(0,0). (The other first level arrays and second control cells have similar topology). Array A1(0,0) includes sixteen first level switch cells L1(i,j). Cells L1(0,j) through L1(3,j) are connected to ports P0 through P3 respectively and to word lines W0 through W3, respectively. Cells L1(i,0) through L1(i,3) are connected to ports P16 through P19, respectively, and to bit lines B0 through B3, respectively. Second level control cell L2(0,0) receives word line W16 and bit line B3 and supplies the control signal CNT2 to each switch cell L1(i,j).

Control cell L2(0,0) stores a bit on bit line B3 whenever a signal on word line W16 is asserted. The state of the bit stored in cell L2(0,0) determines whether the CNT2 signal is asserted. Each switch cell L1(i,j) receives a data bit on bit line Bj and stores it in an internal memory when a signal word line Wi is asserted. When the control signal CNT2 is asserted and the bit stored in switch cell L1(i,j) is true, the switch cell will provide a bi-directional signal path between the two ports to which it is connected. If the bit stored in the switch cell L1(i,j) is false, or if control signal CNT2 is not asserted, then switch cell L1(i,j) will not provide a signal path between the two ports.

Figure 6:
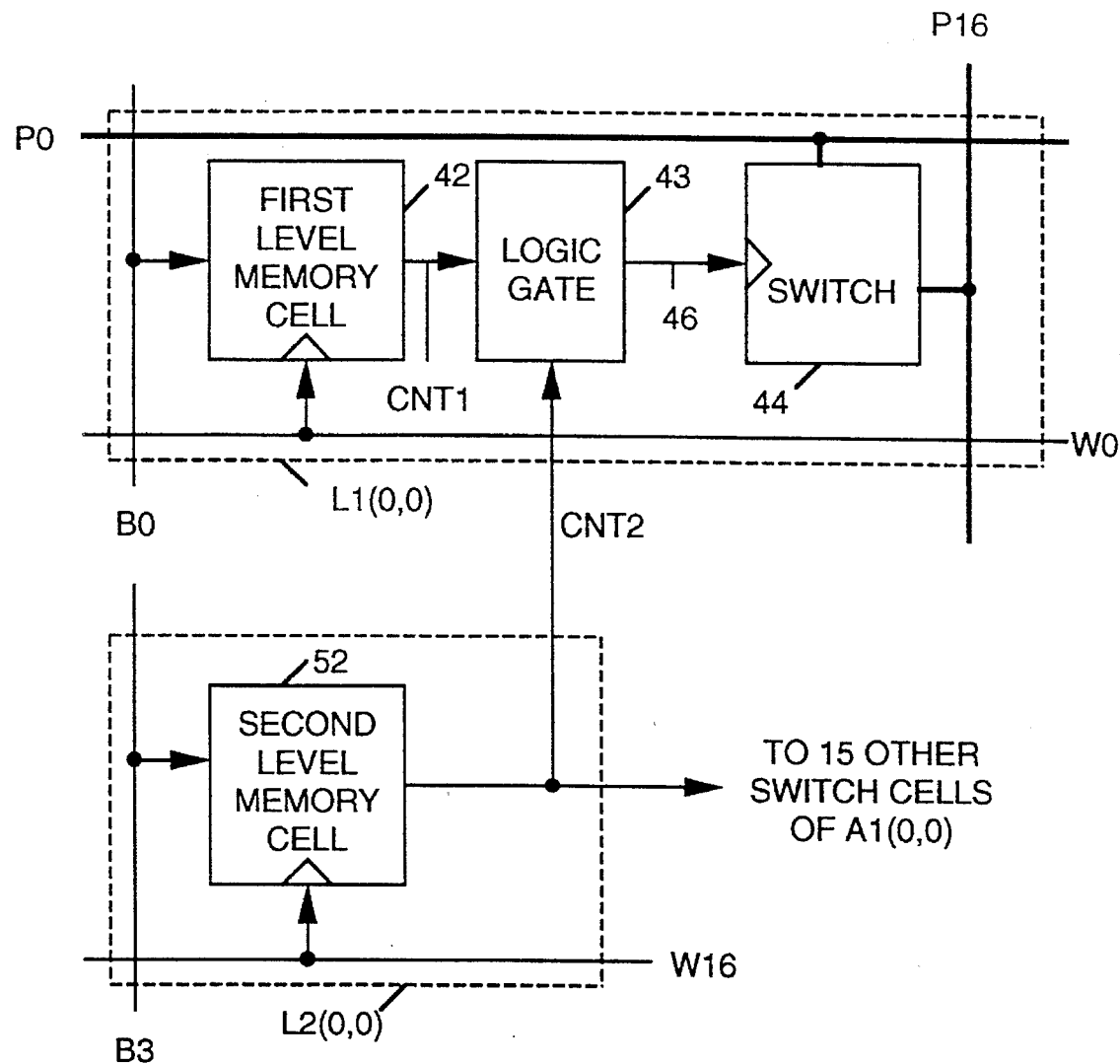
FIG. 6 is a block diagram illustrating a portion of FIG. 5B in greater detail.

FIG. 6 illustrates switch cell L1(0,0) and control cell L2(0,0) of FIG. 5B in greater detail. Other switch cells L1(i,j) are similar in topology to L1(0,0). Switch cell L1(0, 0) includes a memory cell 42, a logic gate 43, and a switch 44. Bit line B0 is connected to a data input of memory cell 42 while word line W0 is connected to a write control input of memory cell 42. When word line W0 is asserted, memory cell 42 stores the data bit currently appearing on bit line B0. Memory cell 42 asserts an output signal CNT1 when its stored bit is set to a logically true state and deasserts signal CNT1 when its stored bit is set logically false state. Signal CNT1 drives one input of logic gate 43.

Second level control cell L2(0,0) consists of a memory cell 52 having a write control input receiving word line W16 and a data input receiving bit line B3. Memory cell 52 asserts the control signal CNT2 when its stored bit is logically true and deasserts control signal CNT2 when its stored bit is logically false. The second level control signal CNT2 drives a second input of logic gate 43 of first level switch cell L1(0,0). Second level control signal CNT2 is also applied as input to similar logic gates in all 15 other first level switch cells L1(i,j) of array A1(0,0) of FIG. 5B. Logic gate 43, suitably an AND gate, asserts an output control signal 46 when control signals CNT1 and CNT2 are concurrently asserted. Switch 44, suitably a pass transistor connected between ports P0 and P16 receiving signal 46 at its gate, provides a bi-directional signal path between ports P0 and P16 when control signal 46 is asserted. Thus switch 44 provides a signal path between ports P0 and P16 only when bits stored in both memory cells 42 and 52 are set logically true.

Referring again to FIG. 5A, when a bit stored in any second level control cell L2(i,j) is set false, it inhibits switching operation of all of the switch cells of the associated switch cell array A1(i,j). When inhibited, none of the switch cells of an array A1(i,j) will provide signal paths between the ports they interconnect regardless of the state of bits stored in their internal memories. On the other hand, when the bit stored in a second level cell L2(i,j) is set true, the data bits stored in the memories of the switch cells of the associated array A1(i,j) control cell switching operations of the array. Note that when the stored bits in all second level control cells L2(i,j) are set to the true logic state, switch 30 will operate in a manner similar to that of the prior art crossbar switch 10 of FIG. 2.

The utility of the second level cells 2 is apparent when switch 30 is used to provide switchable interconnection between a set of eight 4-bit wide buses BUS0–BUS7. For example, ports P0–P3 may be connected to one 4-bit bus B0, ports P4–P7 may be connected to a second 4-bit bus B1, etc. To program switch 30 to quickly connect any bus BUS0–BUS3 between any bus BUS4–BUS7, we first set the bit stored in each second level control cell L2(i,j) false. Thus all switch cells are inhibited and no buses are initially interconnected. We then program all of arrays A1(i,j) to provide (when subsequently enabled by a true CNT2 bit) any desired connection between any one of buses BUS0–BUS3 and any one of buses BUS4–BUS7. For example, referring to FIG. 5B, we could store a true bit in each cell L1(i,i) along the main diagonal of array A1(0,0) and a false bit in every other cell L1(i,j). This permits array A1(0,0) to interconnect BUS0 and BUS4 when enabled by a true CNT2 signal. Referring again to FIG. 5A, all other arrays A1(i,j) can be programmed in a similar fashion such that when enabled, each array A1(i,j) will appropriately route signals between the two buses to which it is connected.

Thereafter, to initially connect, for example BUS0 to BUS4, we now set to true the bit stored in L2(0,0). This drives CNT2 true which in turn enables array A1(0,0). If, for example, we subsequently wish to disconnect BUS0 from BUS4 and reconnect BUS0 to BUS5, we store a true bit in second level control cell L2(0,1) and a false bit in second level control cell L2(0,0). Array A1(0,0) is then inhibited, thereby breaking the signal paths between BUS0 and BUS4.

While array A1(0,1) is enabled it establishes the signal paths between BUS0 and BUS5. Note that when switching BUS0 from BUS4 to BUS5, we need transmit only 21 bits over control bus 32 of FIG. 4. We first place a 16-bit data word in register 38 of FIG. 4 wherein bit B7 is true and all other bits are false. We then send a five bit row address to decoder 16 causing it to assert the W16 word line.

Thus to switch BUS0 from BUS4 to BUS5 requires a total of 21 data cycles of serial control bus 32. In contrast, the prior art switch 10 of FIGS. 1 and 2 requires transmission of 80 bits on control bus 12 to perform a similar switching operation. As may be seen from FIG. 2, all 16 switch cells 20 along each word line W0–W3 would have to be reprogrammed. This would require transmission along bus 12 of four 16-bit data words and four 4-bit address words. Thus the hierarchical switching array of FIG. 5, in accordance with the present invention, can switch four-bit buses nearly four times faster than the prior art switching array of FIG. 2 given control buses of similar speed.

The hierarchical crossbar switch may be viewed as comprising two random access memories, a plurality of switch arrays and an array of logic cells. All of the first level memory cells 42 constitute the first random access memory. This first random access memory stores data indicating which switches 44 are to be turned on. All of the second level memory cells 52 constitute the second random access memory. This second random access memory stores data indicating which switch arrays are to be enabled. All of the logic gates 43 comprise the array of logic cells which read the input data stored in the first and second memories and send separate enabling signals to each switch. Each enabling signal switches on the switch cell to which it is sent when data in the first and second random access memories indicate both that the switch cell is to be switched on and that the switch cell array including the switch cell is to be enabled.

Figure 7:
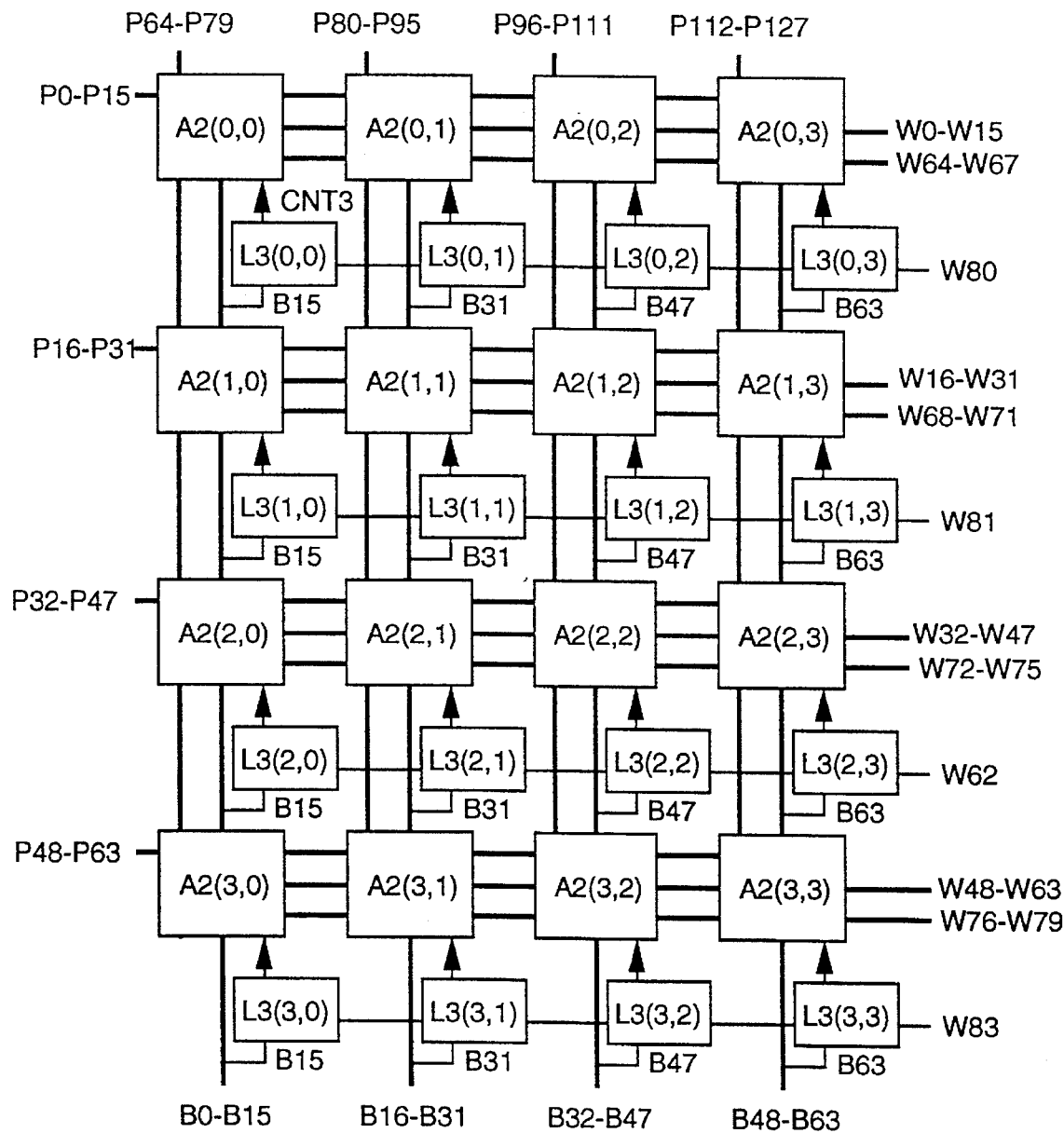
FIG. 7 is a block diagram illustrating a 64 port crossbar switch in accordance with the present invention.

The size and number of levels of the hierarchical crossbar switch may be increased by adding more memories and more logic arrays. FIG. 7 illustrates a 64×64-port, three-level hierarchical crossbar switch 60. Switch 60 includes an array of sixteen 16×16-port, two-level hierarchical crossbar arrays A2(i,j), where i and j are members of the set {0, 1, 2, 3). Each array A2(i,j) is substantially similar in topology to the 16×16 port crossbar switch 30 of FIG. 5. Arrays A2(0,j), A2(1,j), A2(2,j) and A2(3,j) are connected to ports P0–P15, P16–P31, P32–P47, and P48–P63, respectively, and receive word lines W0–W15, W16–W31, W32–W47, and W48–W63, respectively, which address the first level switch cells therein. Arrays A2(0,j), A2(1,j), A2(2,j) and A2(3,j) also receive word lines W64–W67, W68–W71, W72–W75 and W76–W79, respectively, which address second level control cells therein. Crossbar switch cells A2(i,0), A2(i,1), A2(i,2) and A2(i,3) are also connected to ports P64–P79, P80–P95, P96–P111 and P112–P127, respectively, and store data bits conveyed on bit lines B0–B15, B16–B31, B32–B47, and B48–B63, respectively.

Switch 60 also includes an array of sixteen third level control cells L3(i,j), each supplying a control signal CNT3 to a corresponding one of second level arrays A2(i,j). When asserted, the control signal CNT3 enables the interconnect operations of the second level array. When not asserted, control signal CNT3 inhibits the interconnect operation of the second level array A2(i,j). Third level control cells L3(0,j), L3(1,j), L3(2,j) and L3(3,j) are write enabled by word lines W80 through W83, respectively. Third level cells L3(i,0), L3(i,1), L3(i,2) and L3(i,3) store bits conveyed on bit lines B15, B31, B47 and B63, respectively. The topology of a system using switch 60 would be similar to switching system 28 of FIG. 4 except that row address decoder 36 would decode a 7-bit row address to address any of 84 word lines W0–W84 and register 38 would store 64 bits for transmission on 64 bit lines B0–B63.

Figure 8:
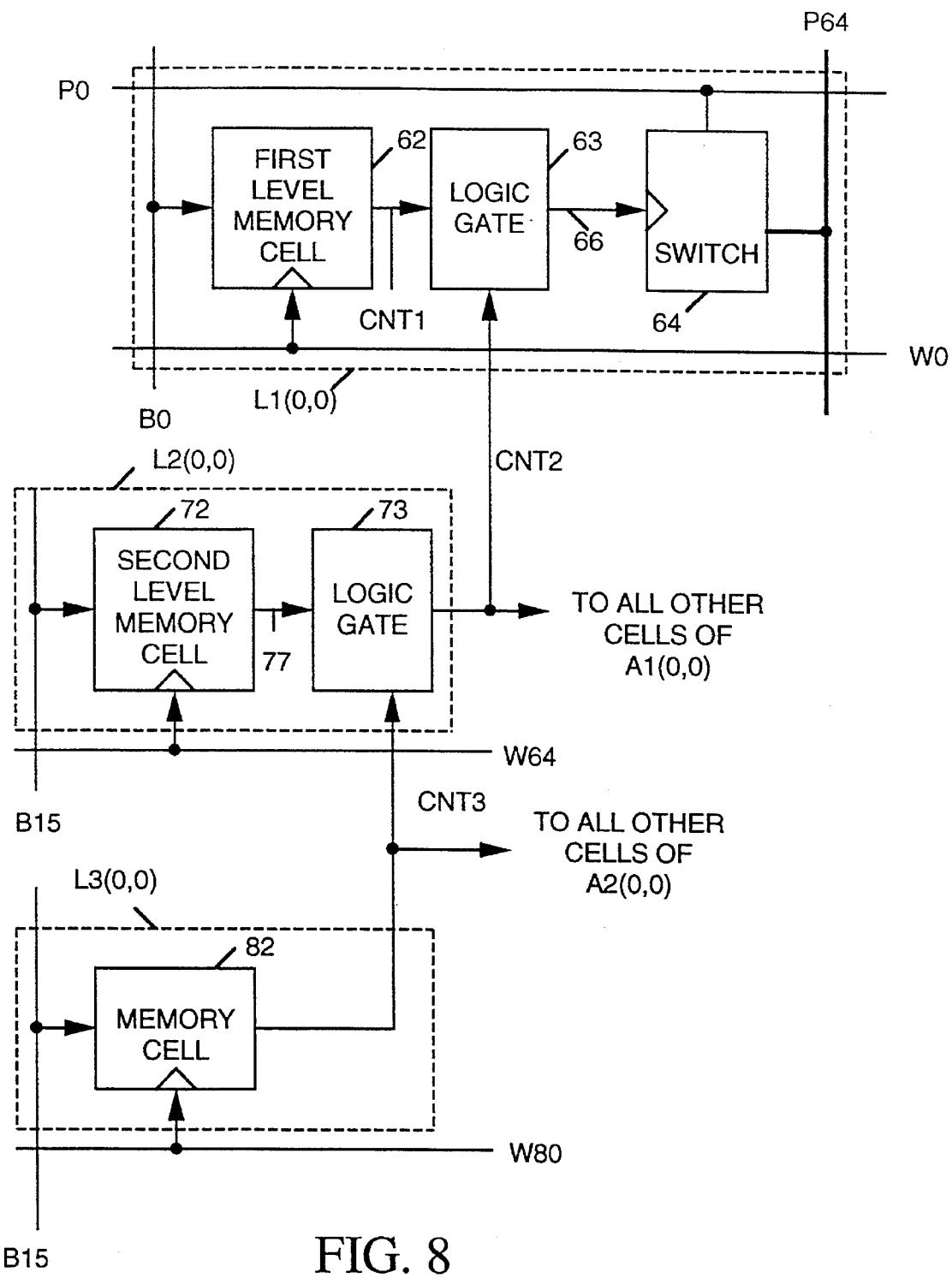
FIGS. 8 and 9 are block diagrams illustrating details of first, second, and third level switch cells of the crossbar switch of FIG. 7.

FIG. 8 illustrates details of a typical first level switch cell L1(0,0) located in array A2(0,0) of FIG. 7, a second level control cell L2(0,0) also located in array A2(0,0) of FIG. 7, and the third level control cell L3(0,0) that controls array A2(0,0). In this example, the first level switch cell L1(0,0) is connected to word line W0, bit line B0 and ports P0 and P64. Switch cell L1(0,0) includes a memory cell 62, a logic gate 63, and a bi-directional switch 64. Bit line B0 is connected to a data input of memory cell 62 while word line W0 is connected to a write control input of memory cell 62. When word line W0 is asserted, memory cell 62 stores the data bit currently appearing on bit line B0. Memory cell 62 asserts an output first level control signal CNT1 when its stored bit is set to a logically true state and deasserts signal CNT1 when its stored bit is set to a logically false state. Control signal CNT1 is applied to an input of logic gate 63.

Second level control cell L2(0,0) includes a memory cell 72 having a write control input receiving word line W64 and a data input receiving bit line B15. Memory cell 72 asserts an output signal 77 when its stored bit is set logically true and deasserts signal 77 when its stored bit is set logically false. Second level control cell L2(0,0) also includes a logic gate 73 receiving control signals 77 and the CNT3 output signal of third level control cell L3(0,0) as inputs and producing the CNT2 signal as output.

Third level control cell L3(0,0) consists of a memory cell 82 having a write control input receiving word line W80 and a data input receiving bit line B15. Memory cell 82 asserts the output second level control signal CNT3 when its stored bit is set logically true and deasserts signal CNT3 when its stored bit is set logically false. Control signal 77 and the third level control signal CNT3 provide inputs to logic gate 73 of second level cell 2. Third level control signal CNT3 is also applied as input to similar logic gates 73 in all 15 other second level cells (not shown) of the same array A2(0,0). Logic gate 73, suitably an AND gate, asserts second level control signal CNT2 when signals 77 and CNT3 are concurrently asserted.

First level memory cell 62 output signal CNT1 and the second level control signal CNT2 provide inputs to logic gate 63 of first level cell L1(0,0). Second level control signal CNT2 is also applied as input to similar logic gates 63 in all 15 other first level cells A(i,j) of the same array of the same switch array A1(0,0). Logic gate 63, suitably an AND gate, asserts an output switch control signal 66 when signals CNT1 and CNT2 are concurrently asserted. Switch 64 is connected between ports P0 and P64 and provides a bi-directional signal path there between when control signal 66 is asserted. Thus switch 64 interconnects ports P0 and P64 only when bits stored in all three memory cells 62, 72 and 82 are set logically true.

Referring again to FIG. 7, crossbar switch 60 may be used, for example to selectively interconnect 4, 8, 16 or 32 bit buses and can quickly change connections between the buses by changing only the data stored in the various second or third level control cells.

Figure 9:
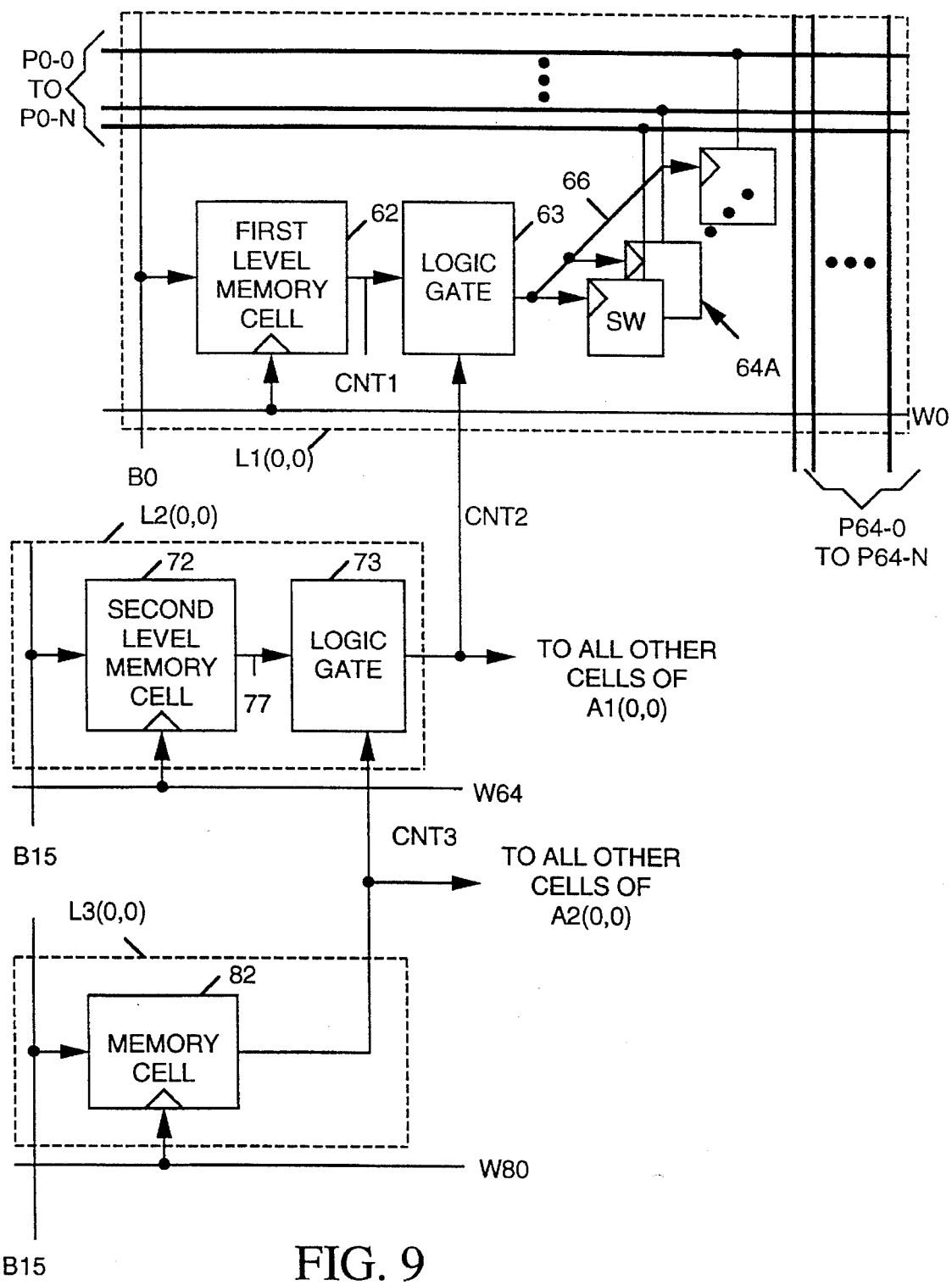

In an alternative embodiment of the invention, each port P0–P15 of hierarchical crossbar switch 30 of FIG. 4 is an N-bit parallel port where N is a number greater than one. For example when N is 8, port P0 is an 8-bit parallel port. FIG. 9 is a modified version of FIG. 8 illustrating the internal construction of the alternative embodiment of switch 30. The second and third level control cells L3 and L2 of FIG. 9 are identical to those of FIG. 8. However the first level control cells of FIG. 9 differ from those of FIG. 8 in that cell L1 of FIG. 9 includes N switches SW(0) through SW(N–1) rather than one switch 64 as seen in cell L1 of FIG. 8. In FIG. 9, the parallel "P0" port comprises N port lines P0(0) through P0(N–1) and the parallel "P64" comprises N port lines P64(0) through P64(N–1). Each switch SW(i) interconnects corresponding port lines P0(i) and P64(i). The control signal 66 output of logic gate 63 is supplied in parallel to the control inputs of all switches 64 so that they all switch concurrently.

While the foregoing specification has described preferred and alternative embodiments of the present invention, one skilled in the art may make many modifications to the preferred embodiment without departing form the invention in its broader aspects. For example, referring to FIG. 8, one could provide a fourth control level by inserting a new logic gate (similar to gate 73) between memory cell 82 and logic gate 73 and providing a fourth level memory cell to control a second input of the new logic gate. The appended claims therefore are intended to cover all such modifications as fall within the true scope and spirit of the invention.

We claim:

1. A hierarchical crossbar switch receiving input data, the crossbar switch comprising:

a plurality of signal ports;

a plurality of switch arrays, each switch array comprising a plurality of switch cells, each switch cell interconnecting a unique pair of said signal ports and providing a signal path between the signal ports it interconnects when switched on by an enabling signal;

a first memory for receiving and storing a first portion of said input data indicating particular switch cells to be switched on;

a second memory for receiving and storing a second portion of said input data indicating particular ones of said switch arrays to be enabled; and logic means connected for reading the input data stored in the first and second memories and for sending separate enabling signals to each switch cell, each enabling signal switching on the switch cell to which it is sent only when data in the first and second memories indicate both that the switch cell is to be switched on and that the switch cell array including the switch cell is to be enabled.

2. The hierarchical crossbar switch in accordance with claim 1 wherein said signal path is a bi-directional signal path for conveying bi-directional signals.

3. The hierarchical crossbar switch in accordance with claim 1 wherein said first and second memories are random access memories.

4. A hierarchical crossbar switch responsive to input programming data comprising:

a plurality of signal ports;

a plurality of switch arrays, each switch array comprising a plurality of switch cells, each switch cell receiving a separate one of a plurality of first level control signals, and each switch cell being connected between a unique pair of said signal ports for providing a signal path there between when the received first level control signal is asserted, each switch array further comprising first level control means for receiving a first portion of said programming data and receiving a separate one of a plurality of second level control signals, and for transmitting to said switches said plurality of first level control signals, wherein said first level control means asserts said first level control signals in response to the received programming data only when said saparate one of said second level control signals is asserted; and second level control means receiving a second portion of said programming data for asserting said plurality of second level control signals in response to particular values of said second portion of input data.

5. The hierarchical crossbar switch in accordance with claim 4 wherein said signal path conveys signals bi-directionally between said unique pair of said signal ports.

6. An apparatus for routing signals between signal ports in response to programming data received as input thereto, the apparatus comprising:

a plurality of signal ports;

a plurality of first arrays of first memory cells, each first memory cell storing a separate first bit of said programming data and generating a separate first signal indicating a state of the stored first bit;

a second array of second memory cells, each second memory cell storing a separate second bit of said programming data and generating a separate second signal indicating a state of the stored second bit;

a plurality of third arrays of logic cells, each third array corresponding to a separate one of said second memory cells, each logic cell receiving a separate one of the first signals generated by the first memory cells and all logic cells of each third array receiving the second signal generated by the corresponding second memory cell, each logic cell producing a switch control signal in response to a combination of states indicated by the first and second signals received by the logic cell; and a fourth array of switches, each switch receiving a switch control signal produced by a separate one of said logic cells and each switch providing a signal path between a separate pair of said signal ports in response to the received switch control signal.

7. The apparatus in accordance with claim 6 wherein the signal path provided by each switch is a bi-directional signal path.

8. An apparatus for selectively routing signals between signal ports in response to a first data bit and a plurality of second data bits received as input thereto, the apparatus comprising:

a first memory for receiving storing a first bit of said data bits and generating a first control signal indicating a state of said first data bit; and a plurality of switch cells, each switch cell connected between a separate pair of said signal ports, each switch cell receiving a separate bit of said second data bits, and each switch cell comprising:

a second memory for receiving and storing said separate bit and producing a second control signal indicating a state of said separate bit, a logic gate receiving said first and second control signals, for generating a third control signal in response to a logical combination of states indicated by said first and second control signals, and a switch for providing a signal path between the pair of signal ports in response to said third control signal.

9. A hierarchical crossbar switch receiving input data, the crossbar switch comprising:

a plurality of parallel ports;

a plurality of switch arrays, each switch array comprising a plurality of switch cells, each switch cell interconnecting a unique pair of said parallel ports and providing a parallel signal path between the parallel ports it interconnects when switched on by an enabling signal;

a first memory for receiving and storing a first portion of said input data indicating particular switch cells to be switched on;

a second memory for receiving and storing a second portion of said input data indicating particular ones of said switch arrays to be enabled; and logic means connected for reading the input data stored in the first and second memories and for sending separate enabling signals to each switch cell, each enabling signal switching on the switch cell to which it is sent only when data in the first and second memories indicate both that the switch cell is to be switched on and that the switch cell array including the switch cell is to be enabled.

* * * * *